(12) United States Patent
Tsujimura et al.

(10) Patent No.: US 7,136,297 B2
(45) Date of Patent: Nov. 14, 2006

(54) SEMICONDUCTOR MEMORY DEVICE

(75) Inventors: Kazuki Tsujimura, Shiga (JP);
Hidenari Kanehara, Osaka (JP);
Norihiko Sumitani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/075,740

(22) Filed: Mar. 10, 2005

(65) Prior Publication Data

US 2005/0207212 A1 Sep. 22, 2005

(30) Foreign Application Priority Data

Mar. 16, 2004 (JP) ............... 2004-075161

(51) Int. Cl.
*G11C 11/00* (2006.01)
(52) U.S. Cl. ............... 365/154; 365/189.09; 365/226
(58) Field of Classification Search ........... 365/154, 365/156, 189.09, 226
See application file for complete search history.

(56) References Cited

U.S. PATENT DOCUMENTS 5,472,899 A * 12/1995 Hsue et al. ............ 438/305
6,212,094 B1   4/2001 Rimondi
6,707,707 B1 *  3/2004 Marr .................. 365/154

FOREIGN PATENT DOCUMENTS

JP          1-113995          5/1989

* cited by examiner

*Primary Examiner*—Gene N. Auduong
(74) *Attorney, Agent, or Firm*—McDermott Will & Emery LLP

(57) ABSTRACT

An SRAM includes: a memory cell array; and a control circuit. Each memory cell includes: inverters; and access transistors interposed in lines connecting internal nodes in the respective inverters and a pair of bit lines BIT and NBIT. The control circuit includes a bias circuit for transmitting signals to the bit lines BIT and NBIT. A memory cell power supply terminal and a control circuit power supply terminal are isolated from each other. When power is turned on, the bias circuit sets one of the bit lines at a power supply potential (high potential) and the other bit line at a ground potential, so that a minute potential difference is generated between the internal nodes and thereby data is initialized. Transistors in the memory cell do not need to be asymmetric.

18 Claims, 10 Drawing Sheets

SEMICONDUCTOR MEMORY DEVICE

CROSS-REFERENCE TO RELATED APPLICATION

This Nonprovisional application claims priority under 35 U.S.C. §119 (a) on Patent Application No.2004-075161 filed in Japan on Mar. 16, 2004, the entire contents of which are hereby incorporated by reference.

BACKGROUND OF THE INVENTION

1. Field of the Invention

The present invention relates to semiconductor memory devices each including memory cells arranged in an array of columns and rows and capable of performing write and read operations at random.

2. Description of the Prior Art

As conventional semiconductor memory devices, semiconductor memory devices in each of which data read out immediately after power-on is initialized to a predetermined value, e.g., a device disclosed in Japanese Unexamined Patent Publication (Kokai) No. 01-113995, are known.

FIG. 1 is a circuit diagram showing a memory cell (an SRAM memory cell) of the conventional semiconductor memory device disclosed in the above publication. This semiconductor memory device includes a memory cell array in which memory cells 101 are arranged in rows and columns. Each of the memory cells 101 includes: inverters 101a and 101b; and access transistors Ta1 and Ta2. Each of the inverters 101a and 101b is provided between a power-supply terminal and a ground terminal and configured by connecting a p-channel field effect transistor (p-FET) Tp and an n-channel field effect transistor (n-FET) Tn in series via an internal node 101c or 101d. The access transistor Ta1 or Ta2 is connected between the internal node 101c or 101d in the inverter 101a or 101b, respectively, and one of a pair of bit lines BIT and NBIT, respectively. The gates of the access transistors Ta1 and Ta2 are connected to a word line WL. A state in which one of the internal nodes 101c and 101d has a high potential and the other has a low potential corresponds to data "1" and the opposite state corresponds to data "0". Under these conditions, an input/output circuit is configured to write and read data in/from some of the memory cells 101 selected by the word line WL via the bit lines BIT and NBIT.

In the semiconductor memory device shown in FIG. 1, the gate length or the gate width of each FET in the inverter 101a in each of the memory cells 101 differs from the gate length or the gate width of each FET in the other inverter 101b. This configuration causes a difference in current driving ability between the inverters 101a and 101b, so that potentials of the internal nodes 101c and 101d in the memory cells 101 differ from each other when power is turned on. Accordingly, initialization is performed such that the memory cell 101 stores data "0" or "1".

However, the conventional semiconductor memory devices have the following drawbacks.

In the conventional semiconductor memory device shown in FIG. 1, the two inverters 101a and 101b in the memory cell have different gate lengths or gate widths as described above. With such a configuration, initialization is performed to obtain only one state in which data "0" or "1" is stored. In addition, since the inverters 101a and 101b have different current driving abilities, the speed at reading initialized data is different from the speed at reading data having an inverted logical value of the initialized data. Moreover, the structure in which the gate sizes of the FETs in the respective inverters are not balanced causes another drawback in which the data holding characteristic (noise immunity) of memory cells and the speed of reading from the memory cells are readily affected by variations in fabrication.

SUMMARY OF THE INVENTION

It is therefore an object of the present invention to provide a semiconductor memory device capable of performing initialization at power-on of a memory cell array by providing means for generating a potential difference between internal nodes in inverters in a memory cell without the necessity to keep a difference between design sizes of transistors in the inverters in the memory cell.

Specifically, a semiconductor memory device according to the present invention includes: a memory cell power supply terminal for supplying a power supply potential to memory cells in a memory cell array; and a control circuit power supply terminal electrically separated from the memory cell power supply terminal and used for supplying a power supply potential to the control circuit. Each of the memory cells includes first and second access transistors, one of which is interposed between one of first and second internal nodes in a pair of first and second inverters and one of the bit lines and the other of which is interposed between the other one of the first and second internal nodes and the other bit line.

With this configuration, at start up, if voltages applied to the respective bit lines have a level difference, a potential difference is generated between the first and second internal nodes in each of the memory cells by utilizing drain leakage current of the first and second access transistors in the memory cells, thereby performing initialization of data of the memory cells as intended.

It is preferable that at startup, a power supply potential is supplied to the control circuit and then a power supply potential is supplied to the memory cell array. Then, a sufficient potential difference is generated between the first and second internal nodes in each of the memory cells before power is supplied to the memory cell array. This further ensures initialization.

The semiconductor memory device preferably further includes bit line potential fixing means for fixing only one of the bit lines at a high potential after the power supply potential has been supplied to the control circuit and before the power supply potential is supplied to the memory cell array, upon reception of an initializing signal at the startup.

The bit line potential fixing means may selectively fix only a predetermined one of the bit lines at the high potential.

The semiconductor memory device preferably further includes bit line potential fixing means for fixing one of the bit lines at a high potential and fixing the other bit line at a ground potential after the power supply potential has been supplied to the control circuit and before the power supply potential is supplied to the memory cell array, upon reception of an initializing signal at the startup. Then, generation of the potential difference between the first and second internal nodes is further ensured.

In this case, the bit line potential fixing means may selectively fix a predetermined one of the bit lines at the high potential and selectively fix the other bit line at the ground potential.

The semiconductor memory device preferably further includes an intermediate potential generator for generating an intermediate potential between the power supply potential and the ground potential of the control circuit, and the high potential fixed by the bit line potential fixing means is preferably the intermediate potential. Then current consumption is suppressed.

The intermediate potential generator preferably has a configuration including transistor columns each formed by connecting a p-channel field effect transistor including short-circuited gate and drain and an n-channel field effect transistor in series, or by connecting a p-channel field effect transistor including short-circuited gate and drain and a p-channel field effect transistor in series, and the transistor columns are preferably associated with the respective bit lines.

The bit line potential fixing means preferably also serves as a precharging circuit or a sense amplifier. Then, the circuit configuration is simplified.

The semiconductor memory device preferably further includes a substrate potential controlling circuit for applying a forward bias to a substrate region in the memory cell array or a substrate region of the drive transistor and the access transistor in one of the first and second inverters in each of the memory cells. Then, leakage current is increased, thus further ensuring initialization of data.

The semiconductor memory device preferably further includes a sense amplifier for detecting an initialization state of the memory cell array, and the substrate potential controlling circuit preferably controls the amount of the forward bias applied to the substrate region in the memory cell array, in accordance with the initialization state of the memory cell array.

The semiconductor memory device preferably further includes delay means for supplying a power supply potential to the memory cell array only when a given delay time has elapsed after reception of the initializing signal. Then, a potential difference is generated between the first and second internal nodes with a sufficient time, so that reliability of initialization of data is enhanced.

The semiconductor memory device preferably further includes: a sense amplifier for detecting an initialization state of the memory cell array; a substrate potential controlling circuit for controlling the amount of a forward bias applied to a substrate region in the memory cell array, in accordance with the initialization state of the memory cell array; and setting means for setting the amount of the forward bias and the delay time.

In a case where the drive transistors are n-channel transistors, the semiconductor memory device preferably further includes a substrate potential controlling circuit for controlling a source potential of each of the drive transistors between a floating state and a ground state. Then, it is possible to interrupt a path for leakage current of the drive transistors. Accordingly, even if the substrate bias is not controlled, initialization of data is ensured.

The bit line potential fixing means preferably fixes one of the bit lines connected to at least a selected set of the memory cells arranged in a column in the memory cell array at a high potential and fixes the other bit line at a ground potential.

The semiconductor memory device preferably further includes word line potential opening means for controlling a word line to a floating state when the bit line potential fixing means sets the potential of said one of the bit lines. Then, a potential difference between the first and second internal nodes is further increased by utilizing coupling of parasitic capacitances of the access transistors, thus further ensuring initialization of data.

DESCRIPTION OF THE PREFERRED EMBODIMENTS

Hereinafter, embodiments of the present invention will be described with reference to the drawings.

EMBODIMENT 1

Figure 1:
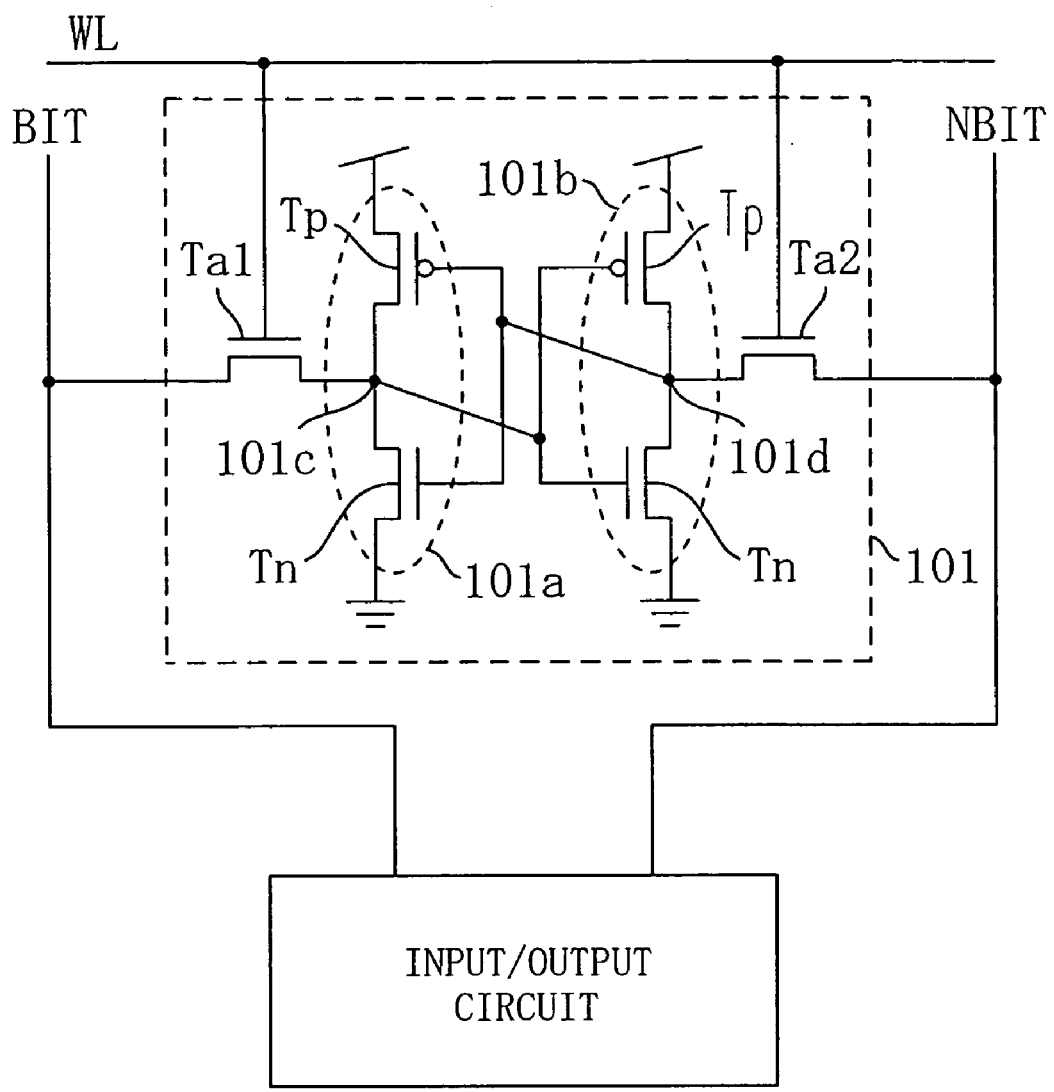
FIG. 1 is a circuit diagram showing a memory cell of a conventional semiconductor memory device.
Figure 2:
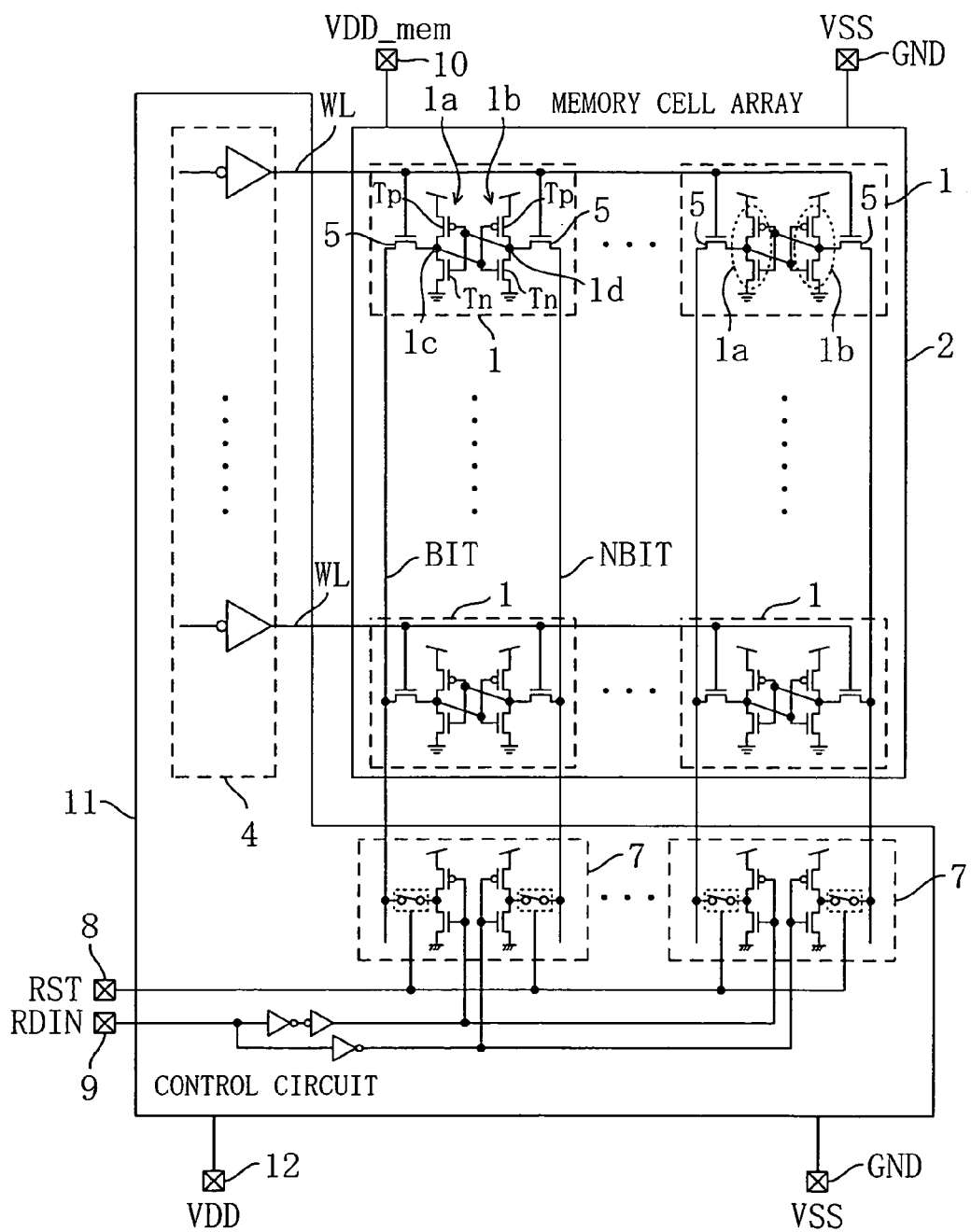
FIG. 2 is a circuit diagram showing a semiconductor memory device according to a first embodiment of the present invention.

FIG. 2 is a circuit diagram showing a static random access memory (hereinafter, referred to as an "SRAM") as a semiconductor memory device according to a first embodiment of the present invention. As shown in FIG. 2, the semiconductor memory device includes a memory cell array 2 in which memory cells 1 are arranged in rows and columns. Each of the memory cells 1 includes: inverters 1a and 1b (first and second inverters); and access transistors 5 and 5 (first and second access transistors.) Each of the inverters 1a and 1b is provided between a power-supply terminal and a ground terminal and is configured by connecting a p-FET Tp (a resistor) and an n-FET Tn (a drive transistor) in series via an internal node 1c or 1d (a first or second internal node), respectively. The access transistors 5 and 5 are connected between the respective internal nodes 1c and 1d in the inverters 1a and 1b and respective ones of a pair of bit lines BIT and NBIT. The gates of the access transistors 5 and 5 in each of the memory cells 1 are connected to a word line WL. Each one of the internal nodes 1c and 1d (output terminals) in the inverters 1a and 1b is connected to the gate (input terminal) of the other one of the inverters 1a and 1b.

The SRAM further includes a control circuit 11 for writing and reading data in/from the memory cells 1. The control circuit 11 includes; a word line driver 4 for activating a word line WL selected in accordance with an address decoding result of a row decoder (not shown); and bias circuits 7 each for transmitting signals to the bit lines BIT and NBIT in accordance with a decoded initializing signal RST and a decoded initialization data signal RDIN input from an initializing signal terminal 8 and an initialization data signal terminal 9, respectively. A large number of circuits and elements other than the circuits and elements shown in FIG. 2 are provided in the SRAM, but are not shown in order to facilitate understanding. For example, sense amplifiers for taking potential differences between the internal nodes 1c and 1d therein as data of the memory cells 1 through the pair of bit lines BIT and NBIT and amplifying the potential differences during read operation of the SRAM are provided in the control circuit 11, but are not shown in the drawing.

As shown in FIG. 2, access transistors 5 in memory cells 1 arranged in a column have their gates connected to word lines WL and their drains connected to a pair of bit lines BIT and NBIT. The bit lines BIT and NBIT are connected to one of the bias circuits 7 associated with this column. A memory cell power supply terminal 10 for supplying a power supply potential VDD_mem to the memory cell array 2, a control circuit power supply terminal 12 for supplying a power supply potential VDD to the control circuit 11 including the word line driver 4 and the bias circuits 7, and a ground GND for supplying a ground potential VSS to the memory cell array 2 and the control circuit 11 are also provided. The memory cell power supply terminal 10 and the control circuit power supply terminal 12 are connected to power supply circuits provided on a chip (not shown) different from a chip on which the SRAM is formed. The memory cell power supply terminal 10 and the control circuit power supply terminal 12 are electrically separated from each other.

Although not shown, switching transistors for switching the power supply potential VDD_mem and the ground potential VSS, respectively, between supply and shut-off are interposed in a line connecting the memory cell power supply terminal 10 and the memory cell array 2 and a line connecting the ground GND and the memory cell array 2, respectively. Switching transistors for switching the power supply potential VDD and the ground potential VSS, respectively, between supply and shut-off are interposed in a line connecting the control circuit power supply terminal 12 and the control circuit 11 and a line connecting the ground GND and the control circuit 11, respectively.

With this configuration, a state in which one of the internal nodes 1c and 1d in each of the memory cells 1 in the memory cell array 2 has a high potential and the other has a low potential corresponds to data "1" and the opposite state corresponds to data "0". Under these conditions, the control circuit 11 writes and reads data in/from some of the memory cells 1 selected by the word line WL via the bit lines BIT and NBIT.

Operation of the semiconductor memory device of this embodiment having the foregoing configuration will be hereinafter described.

Concurrently with the supply of power to the control circuit 11 from the control circuit power supply terminal 12, an initializing signal RST is set at an enable state. By setting the initializing signal RST in the enable state, switching elements (e.g., MOSFETs) in the bias circuits 7 are turned ON. Accordingly, each of the bias circuits 7 selectively makes one of the bit lines BIT and NBIT transition to a power supply potential VDD and the other to a ground potential VSS in accordance with the state of an initialization data signal RDIN. At this time, though the access transistors 5 are OFF, leakage current of the access transistors 5 causes a minute potential difference according to a potential difference between the pair of bit lines BIT and NBIT to appear between the internal nodes 1c and 1d in each of the memory cells 1.

Next, when the power supply potential VDD_mem is supplied from the memory cell power supply terminal 10 to the memory cell array 2 after the appearance of the potential difference between the internal nodes 1c and 1d, the potential difference is amplified by the inverters 1a and 1b and initialization data for setting one of the internal nodes 1c and 1d at a high potential and the other at a low potential is written in each of the memory cells 1. In this case, which one of the internal nodes is set at a high potential is dependent on the levels of voltages applied to the bit lines BIT and NBIT from an associated one of the bias circuits 7. For example, if the initialization data signal RDIN is a signal with a high potential, a signal with a low potential is supplied to the bit line BIT and a signal with a high potential is supplied to the bit line NBIT, so that a potential difference in which the internal node 1c has a low potential and the internal node 1d has a high potential is generated. If the initialization data signal RDIN is a signal with a low potential, the potential relationship is reversed. Accordingly, initialization data is controlled as intended by using the initialization data signal RDIN.

In this embodiment, initialization data is written by utilizing leakage current of the access transistors 5, so that the gate lengths or the gate widths of the inverters 1a and 1b in the memory cells 1 do not need to differ from each other. Accordingly, the speed at reading data is kept uniform irrespective of whether the initialization data is "1" or "0". In addition, transistors in the memory cells have the same gate size, so that symmetries of a circuit (gate lengths and gate widths) and of a layout, which affect data holding characteristics (noise immunity) of the memory cells 1, are maintained. Accordingly, variations in fabrication have little influence on the device of this embodiment.

Initialization data "0" or "1" may be arbitrarily selected in accordance with the potential of the initialization data signal RDIN.

In this embodiment, each of the bias circuits 7 selectively makes one of the bit lines BIT and NBIT transition to the power supply potential and the other to the ground potential in accordance with the initialization data signal RDIN. If the initialization data has been fixed, only a specified one of the bit lines BIT and NBIT may be fixedly set at the power supply potential.

In this embodiment, the power supply potential VDD_mem supplied from the memory cell power supply terminal 10 is a voltage with a high potential. Alternatively, the power supply potential VDD_mem may be a voltage with a low potential. In such a case, the same advantages as in this embodiment are also obtained.

EMBODIMENT 2

Figure 3A:
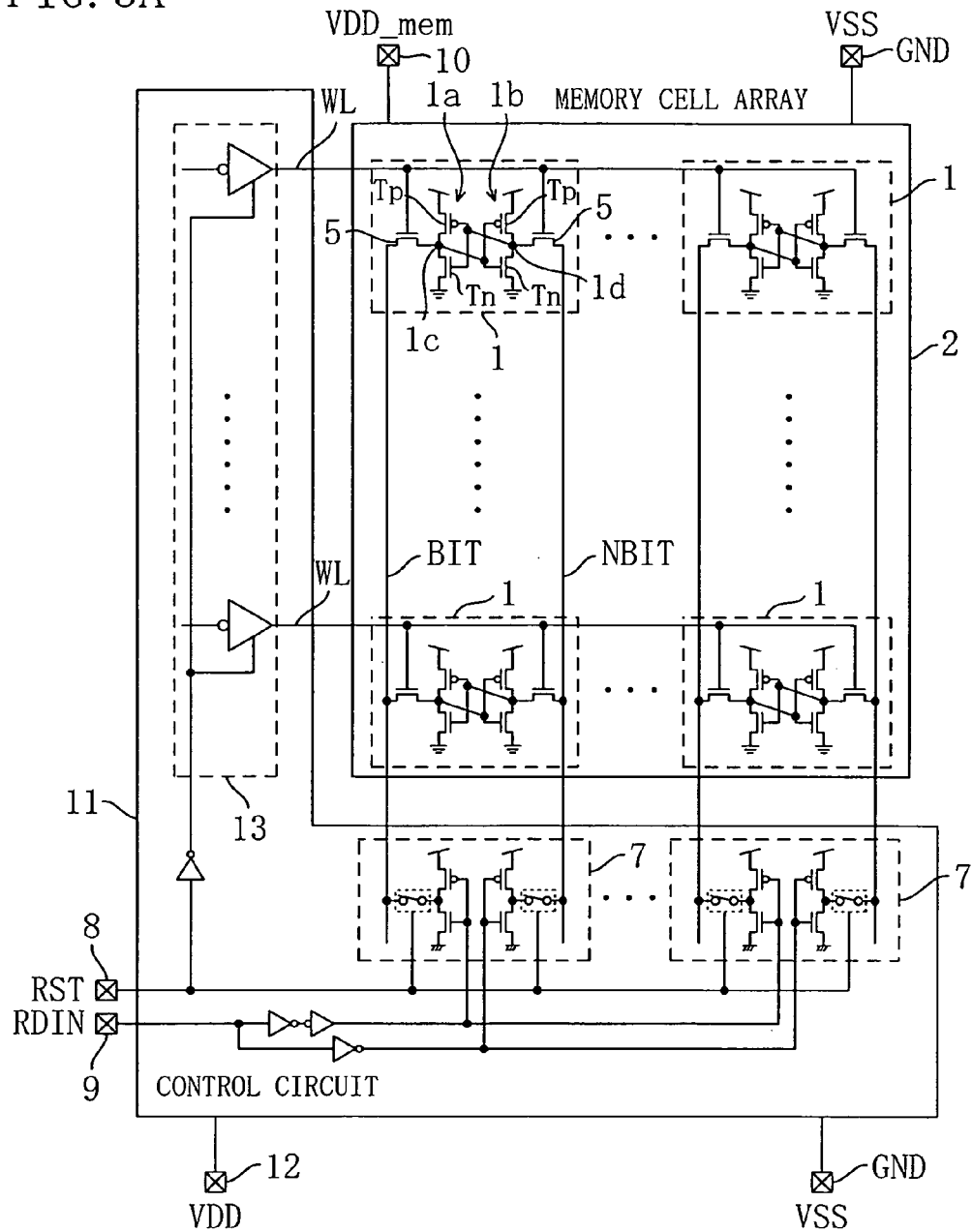
FIG. 3A is a circuit diagram showing a semiconductor memory device according to a second embodiment of the present invention.
Figure 3B:
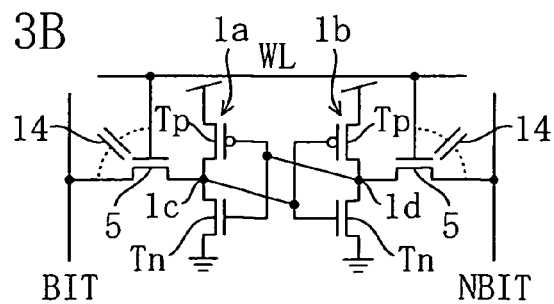
FIG. 3B is a detailed diagram showing the semiconductor memory device of the second embodiment.

FIGS. 3A and 3B are a circuit diagram and a detailed diagram, respectively, showing an SRAM as a semiconductor memory device according to a second embodiment of the present invention. In FIG. 3A, each component identical with that of the SRAM of the first embodiment shown in FIG. 2 is denoted by the same reference numeral, and description thereof will be omitted.

As shown in FIG. 3A, in this embodiment, the word line driver 4 of the first embodiment is replaced by a word line driver 13 with a tristate output. The word line driver 13 of this embodiment is connected to a line extending from an initializing signal terminal 8 via an inverter and receives an inverted signal of an initializing signal RST. As shown in FIG. 3B, a parasitic capacitance 14 (coupling capacitance) appearing between the gate and drain of each of access transistors 5 in memory cells 1 (between a bit line BIT or NBIT and a word line WL) is set at a given value.

Operation of the semiconductor memory device of this embodiment having the foregoing configuration will be hereinafter described. The operation of the SRAM of this embodiment is basically the same as that of the first embodiment, but is different from that of the first embodiment in the following aspects.

When an initializing signal RST is set at an enable state concurrently with the supply of a power supply potential VDD from a control circuit power supply terminal 12 of a control circuit 11, the output of the word line driver 13 changes to a floating state. By setting the initializing signal RST in the enable state, switching elements in bias circuits 7 are turned ON. Then, each of the bias circuits 7 selectively makes one of the bit lines BIT and NBIT transition to the power supply potential VDD and the other to a ground potential VSS in accordance with the state of an initialization data signal RDIN. At this time, since word lines WL are in floating states, the potential of one of the bit lines BIT and NBIT which has transitioned to the power supply potential VDD are mirrored to the word lines WL by the parasitic capacitance 14.

At this time, as in the first embodiment, leakage current of the access transistors 5 causes a minute potential difference according to the potentials of the bit lines BIT and NBIT to appear between internal nodes 1c or 1d in each of the memory cells 1. However, since the word lines WL are in the floating states, coupling of the parasitic capacitances 14 of the access transistors 5 raise the gate voltages and further increase the leakage current, so that the potential differences between the internal nodes 1c and 1d in the memory cells 1 are increased. This further ensures initialization of data.

Accordingly, in this embodiment, in addition to the advantages of the first embodiment, a larger potential difference is generated between the internal nodes 1c and 1d in each of the memory cells 1, so that stable write operation of initialization data is implemented.

EMBODIMENT 3

Figure 4A:
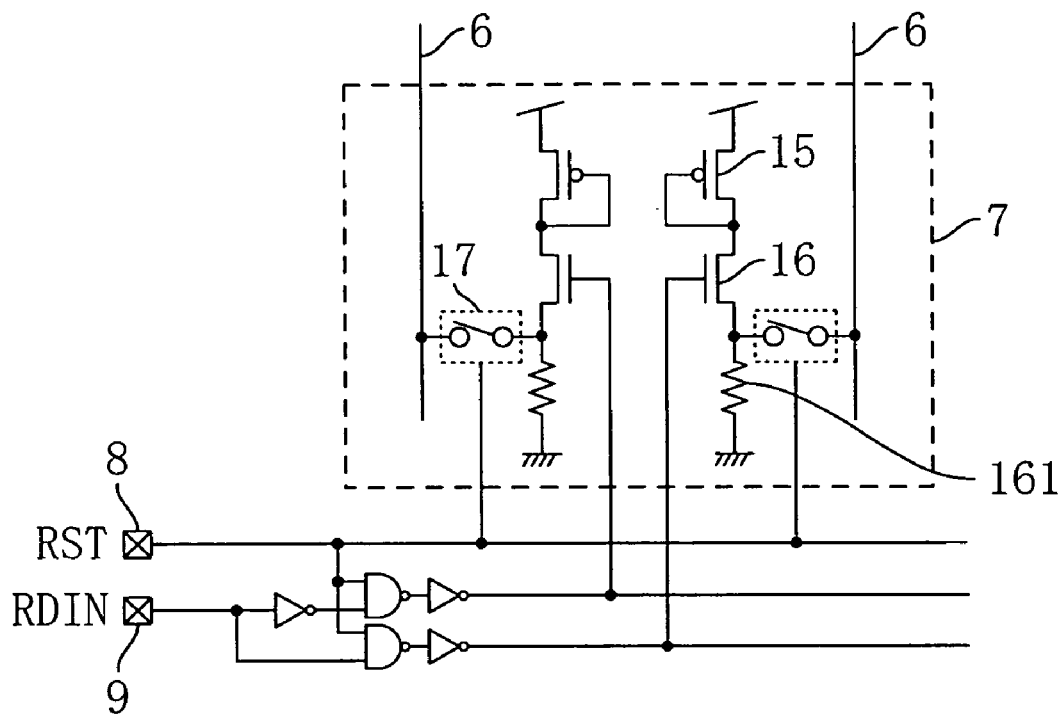
FIG. 4A is a circuit diagram showing a configuration of a bias circuit of a semiconductor memory device according to a third embodiment of the present invention.
Figure 4B:
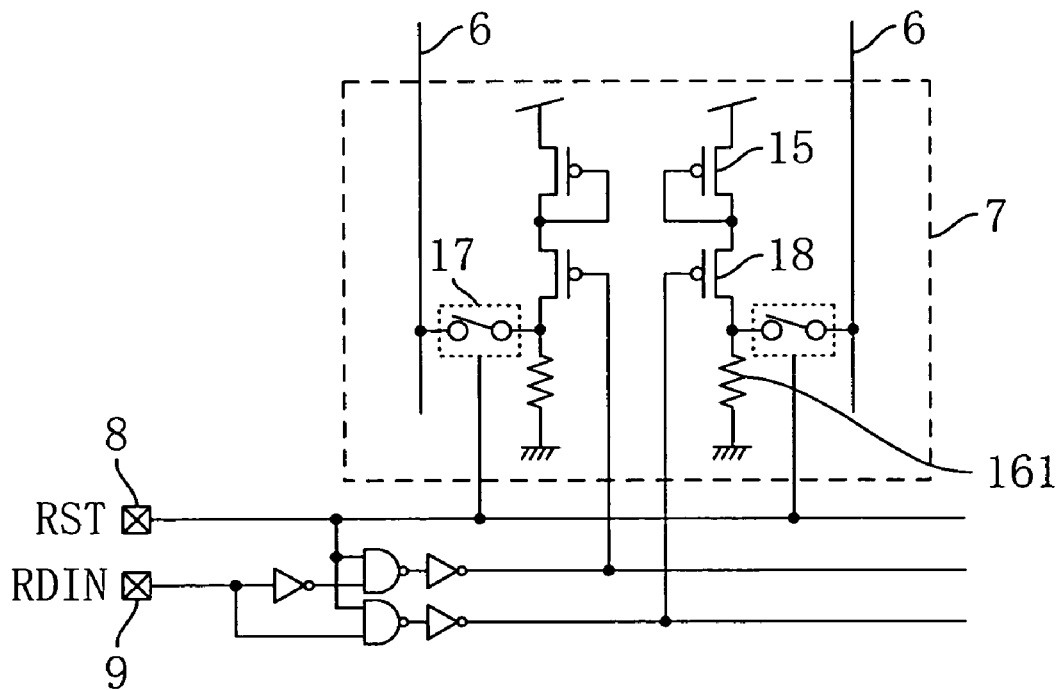
FIG. 4B is a circuit diagram showing another configuration of the bias circuit of the semiconductor memory device of third embodiment.

FIGS. 4A and 4B are circuit diagrams showing two configurations of a bias circuit 7 in an SRAM as a semiconductor memory device according to a third embodiment of the present invention. In FIGS. 4A and 4B, each component identical with that of the SRAM of the first embodiment shown in FIG. 2 is denoted by the same reference numeral, and description thereof will be omitted. The configurations of a memory cell array and a control circuit except for bias circuits 7 in the SRAM of this embodiment are the same as those shown in FIG. 2.

In the example shown in FIG. 4A, each of the bias circuits 7 includes: p-FETs 15 each having short-circuited gate and drain; n-FETs 16; and resistors 161. Respective ones of the p-FETs 15, the n-FETs 16 and the resistors 161 are connected in series between a power-supply terminal and a ground terminal. The sources of the n-FETs 16 are respectively connected to bit lines BIT and NBIT via switching elements 17 (e.g., MOSFETs.) Signals decoded from an initializing signal RST and an initialization data signal RDIN are input to the gates of the respective n-FETs 16. In the example shown in FIG. 4B, the n-FETs 16 provided in the bias circuit 7 shown in FIG. 4A are replaced by p-FETs 18.

Operation of the semiconductor memory device of this embodiment having the foregoing configuration will be hereinafter described.

The operation of the semiconductor memory device of this embodiment is basically the same as that of the first embodiment, but is different from that of the first embodiment in the following aspects.

In the example shown in FIG. 4A, when one of the n-FETs 16 is selected in accordance with the setting of an initialization data signal RDIN in the bias circuit 7, an intermediate potential divided by an associated one of the p-FETs 15 serving as a resistor and an associated one of the resistors 161 is applied to one of the bit lines BIT and NBIT via an associated one of the switching elements 17. Since the other n-transistor 16 is not selected, a ground potential is applied to the other bit line NBIT or BIT via the other resistor 161 and switching element 17. When an initializing signal RST is set in a disable state, each of the n-FETs 16 changes to a non-selected state, so that a path for through current is interrupted.

In this embodiment, in addition to the advantages of the first embodiment, the voltages at the bit lines BIT and NBIT during initialization rise only to the intermediate potential at most, so that current consumption is reduced. In addition, in the case where the p-FETs 18 are provided instead of the n-FETs 16, the source potential of each of the p-FETs 18 is at an intermediate potential and leakage current of the p-FETs 18 is suppressed by a substrate bias effect. Accordingly, current consumption is suppressed while initialization is not performed.

EMBODIMENT 4

Figure 5:
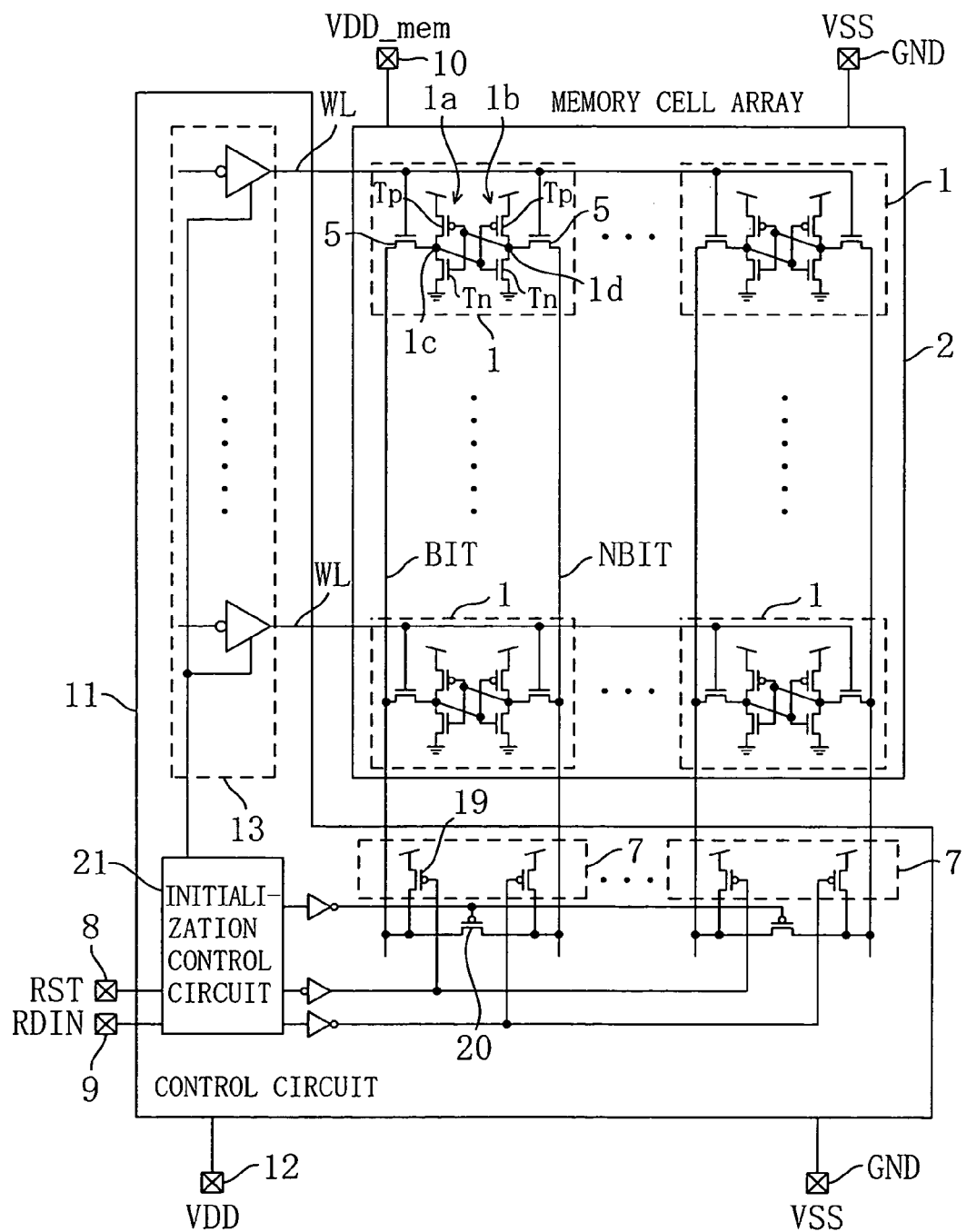
FIG. 5 is a circuit diagram showing a semiconductor memory device according to a fourth embodiment of the present invention.

FIG. 5 is a circuit diagram showing an SRAM as a semiconductor memory device according to a fourth embodiment of the present invention. In FIG. 5, each component identical with that of the SRAM of the second embodiment shown in FIGS. 3A and 3B is denoted by the same reference numeral, and description thereof will be omitted.

As shown in FIG. 5, in this embodiment, an initialization control circuit 21 for controlling bias circuits 7 and a word line driver 13 in accordance with an initializing signal RST and an initialization data signal RDIN is provided. Each of the bias circuits 7 includes a pair of precharging p-FETs 19 for precharging a pair of bit lines BIT and NBIT, respectively. Equalizing p-FETs 20 each for equalizing the bit lines BIT and NBIT are also provided. The gates of the precharging p-FETs 19 and the equalizing p-FETs 20 are connected to the initialization control circuit 21 via respective inverters. The word line driver 13 with a tristate output is connected to the initialization control circuit 21 with no inverters interposed therebetween.

Operation of the semiconductor memory device of this embodiment having the foregoing configuration will be hereinafter described. The operation of the semiconductor memory device of this embodiment is basically the same as that of the second embodiment, but is different from that of the second embodiment in the following aspects.

When an initializing signal RST is input to the initialization control circuit 21 as initialization operation, one of the precharging p-FETs 19 is selected in accordance with the state of an initialization data signal RDIN and a power supply potential VDD is supplied to one of the bit lines BIT and NBIT. At this time, the equalizing p-FETs 20 are in non-selected states and the other bit line NBIT or BIT is in a floating state. Word lines WL are controlled to floating states by the word line driver 13, so that leakage current of access transistors 5 in memory cells 1 increases. Then, the power supply potential VDD appears in internal nodes 1c or 1d in the memory cells 1 via the bit line BIT or NBIT. Thereafter, as in the second embodiment, a power supply potential VDD_mem is supplied to a memory cell array 2, so that potential differences generated in the memory cells 1 by leakage current of the access transistors 5 in the memory cells 1 are increased. In this case, coupling of parasitic capacitances of the access transistors 5 raises the gate voltages and further increases the leakage current, so that the potential differences between the internal nodes 1c and 1d in the memory cells 1 are increased. This further ensures initialization of data.

When the initializing signal RST is set in a disable state, the precharging p-FETs 19, the equalizing p-FETs 20 and the word line driver 13 operate as originally intended in the SRAM.

In this embodiment, in addition to the advantages of the second embodiment, the precharging p-FETs 19 of the SRAM are used for the bias circuits 7 necessary for initialization, so that no bias circuits necessary for initialization need to be additionally provided. Accordingly, in this embodiment, initialization is performed without increase of parasitic capacitances of the bit lines BIT and NBIT, thus obtaining the advantage that a 1s bit line delay during ordinary operation of the SRAM is not harmfully affected.

EMBODIMENT 5

Figure 6:
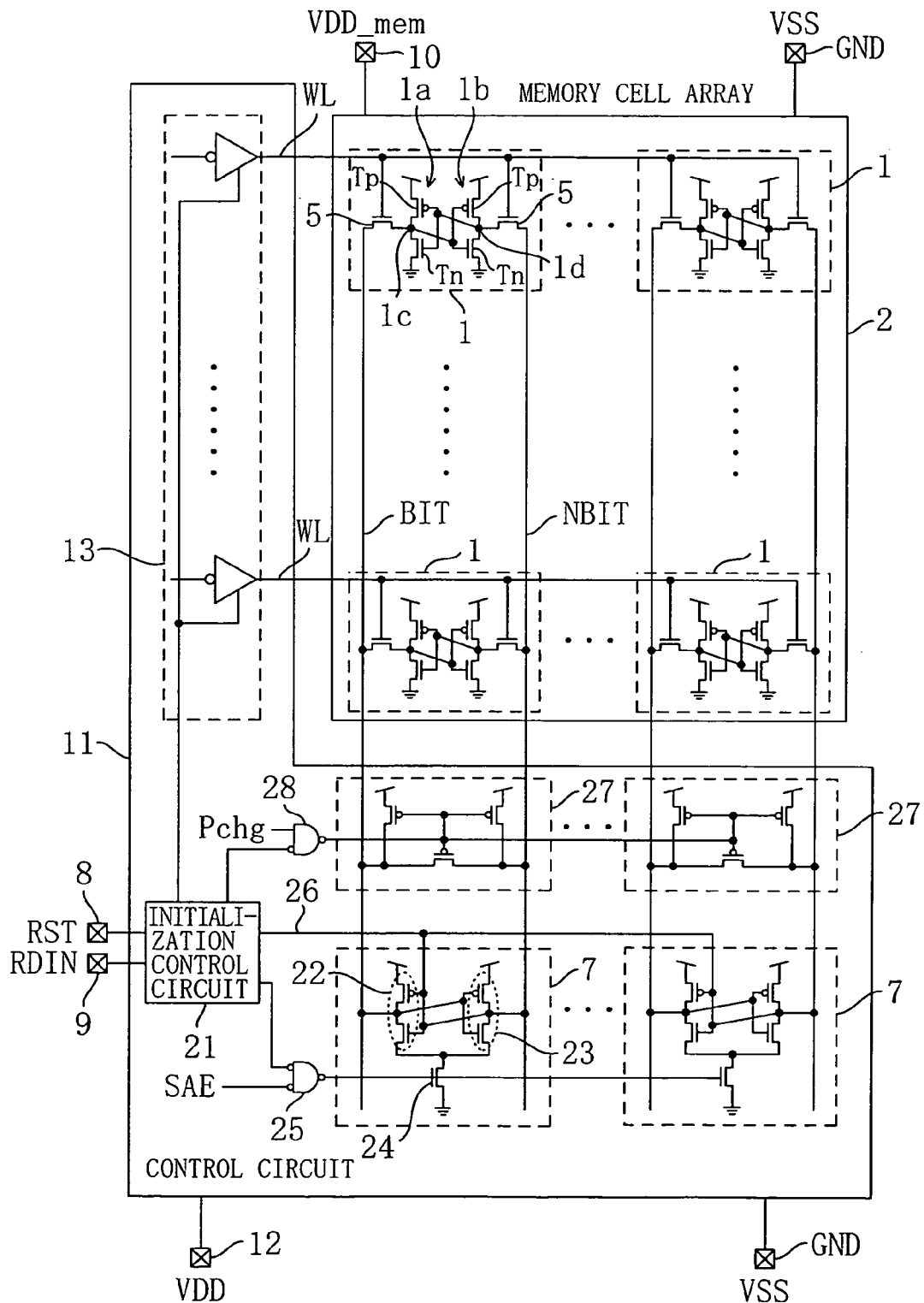
FIG. 6 is a circuit diagram showing a semiconductor memory device according to a fifth embodiment of the present invention.

FIG. 6 is a circuit diagram showing an SRAM as a semiconductor memory device according to a fifth embodiment of the present invention. In FIG. 6, each component identical with that of the SRAM of the fourth embodiment shown in FIG. 5 is denoted by the same reference numeral, and description thereof will be omitted.

As shown in FIG. 6, in this embodiment, bias circuits 7 also serve as sense amplifiers each for amplifying a voltage difference generated between a pair of bit lines BIT and NBIT by a memory cell 1 during read operation of the SRAM. Each of the bias circuits 7 includes inverters 22 and 23 connected in such a manner that each one of the inverters 22 and 23 receives the output of the other. The low-potential sides of the respective inverters 22 and 23 are connected to a ground GND via an n-FET 24 serving as a current supply switch in each of the bias circuits 7. The gates of the n-FETs 24 are connected to an output terminal of a logic gate 25 for outputting a logical sum of the output from the initialization control circuit 21 and a sense amplifier enable signal SAE. The gates of the inverters 22 are connected to a potential fixing line 26 extending from the initialization control circuit 21. Specifically, if a potential fixing signal supplied through the potential fixing line 26 has a high potential, an internal node in the inverter 22 has a low potential (a ground potential VSS) and an internal node in the inverter 23 has a high potential (a power supply potential VDD.) On the other hand, if the potential fixing signal has a low potential, the internal node in the inverter 22 has a high potential and the internal node in the inverter 23 has a low potential. In this manner, the potentials at the gates of the inverters 22 and 23 are fixed.

Precharging/equalizing circuits 27 are interposed between a memory cell array 2 and the bias circuits 7. Each of the precharging/equalizing circuits 27 includes three p-FETs and is connected between the bit lines BIT and NBIT. The precharging/equalizing circuits 27 are connected to the initialization control circuit 21 via a logic gate 28.

Operation of the semiconductor memory device of this embodiment having the foregoing configuration will be hereinafter described. The operation of the semiconductor memory device of this embodiment is basically the same as that of the fourth embodiment, but is different from that of the fourth embodiment in the following aspects.

In this embodiment, when an initializing signal RST is input to the initialization control circuit 21 as initialization operation, the n-FETs 24 are switched to supply current to the bias circuits 7. Then, when a potential fixing signal according to the state of an initialization data signal RDIN is supplied from the potential fixing line 26, the gates of the inverters 22 and 23 in the bias circuits 7 are fixed at a ground potential VSS or a power supply potential VDD. Thereafter, the inverters 22 supply the power supply potential VDD or the ground potential VSS to the bit lines BIT and the inverters 23 supply the ground potential VSS or the power supply potential VDD to the other bit lines NBIT. At this time, the precharging/equalizing circuits 27 are in non-selected states. In addition, a word line driver 13 controls word lines WL to floating states, so that leakage current of access transistors 5 in memory cells 1 increases. On the other hand, the potential (power supply potential VDD or the ground potential VSS) supplied to the bit lines BIT by the inverters 22 appears in internal nodes 1c in the memory cells 1 and the potential (ground potential VSS or the power supply potential VDD) supplied to the other bit lines NBIT by the inverters 23 appears in internal nodes 1d in the memory cells 1. Accordingly, as in the fourth embodiment, when a power supply potential VDD_mem is supplied to the memory cell array 2, potential differences generated in the memory cells 1 by the leakage current of the access transistors 5 in the memory cells 1 are increased. In this case, coupling of parasitic capacitances of the access transistors 5 raises the gate voltages and further increases the leakage current, so that potential differences between the internal nodes 1c and 1d in the memory cells 1 are further increased. This further ensures initialization of data.

When the initializing signal RST is set in a disable state, the potential on the potential fixing line 26 changes to a floating state, so that the bias circuits 7 operate as sense amplifiers. In addition, the precharging/equalizing circuits 27 and the n-FETs 24 functioning as current supply switches operate as originally intended in the SRAM.

In this embodiment, in addition to the advantages of the fourth embodiment, the bit lines BIT are fixed at the power supply potential VDD or the ground potential VSS and the other bit lines NBIT are fixed at the ground potential VSS or the power supply potential VSS at initialization. Accordingly, in this embodiment, a larger potential difference is generated between the internal nodes 1c and 1d in each of the memory cells 1, so that more stable initialization is achieved.

EMBODIMENT 6

Figure 7:
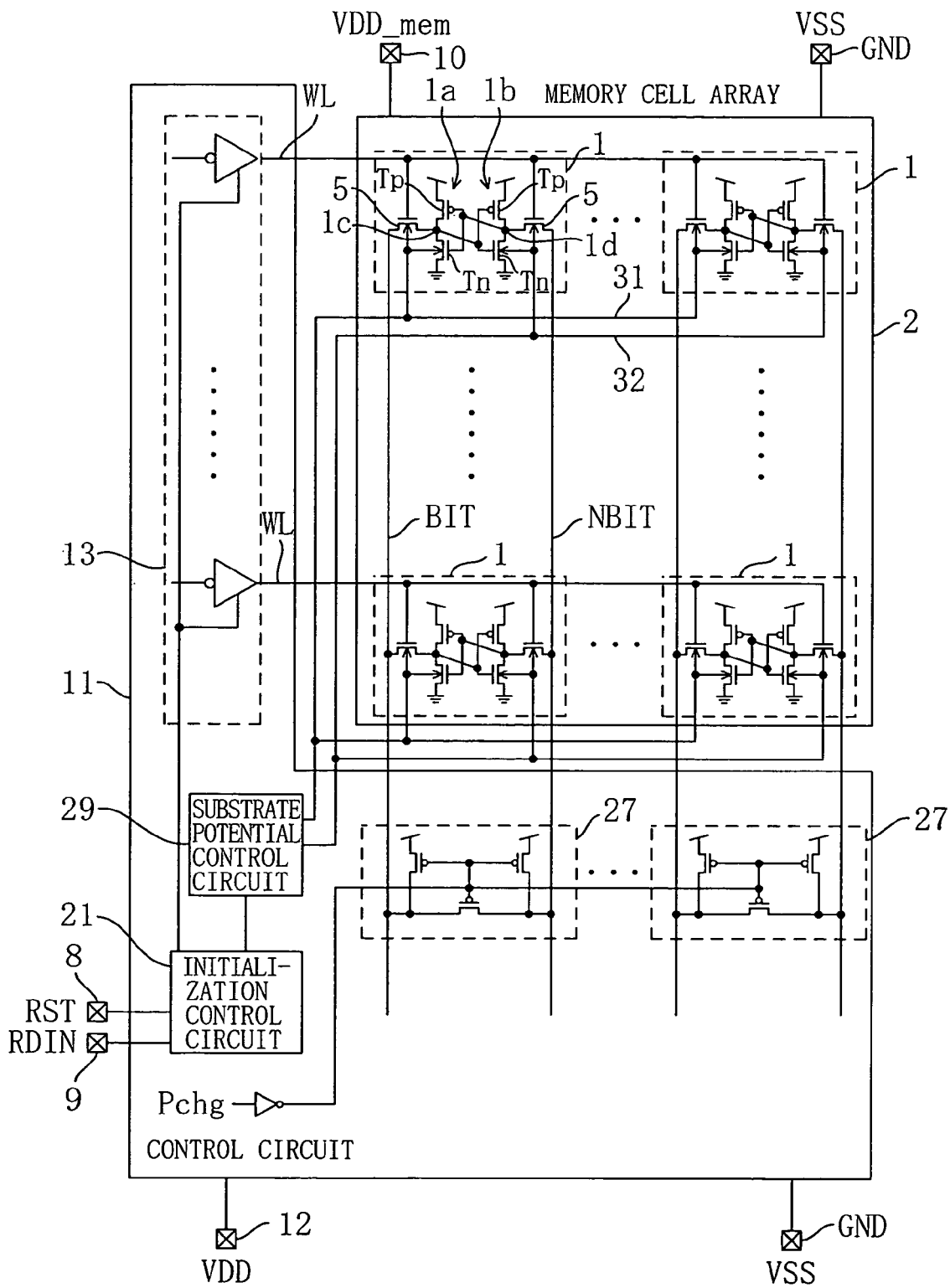
FIG. 7 is a circuit diagram showing a semiconductor memory device according to a sixth embodiment of the present invention.

FIG. 7 is a circuit diagram showing an SRAM as a semiconductor memory device according to a sixth embodiment of the present invention. In FIG. 7, each component identical with that of the SRAM of the fourth embodiment shown in FIG. 5 is denoted by the same reference numeral, and description thereof will be omitted.

As shown in FIG. 7, in this embodiment, a substrate potential control circuit 29 operating in accordance with a control signal from an initialization control circuit 21 is provided. Substrate regions of access transistors 5 and drive transistors Tn in respective inverters in memory cells 1 are connected to substrate potential control signal lines 31 and 32, respectively, and are associated with bit lines BIT and NBIT, respectively. The substrate potential control circuit 29 is connected to the initialization control circuit 21. Precharging/equalizing circuits 27 are connected to the bit lines BIT and NBIT and also connected to precharge signals for ordinary operation of the SRAM.

Operation of the semiconductor memory device of this embodiment having the foregoing configuration will be hereinafter described.

The operation of the semiconductor memory device of this embodiment is basically the same as that of the fourth embodiment, but is different from that of the fourth embodiment in the following aspects. When an initializing signal RST is input to the initialization control circuit 21 as initialization operation, the substrate potential control circuit 29 applies forward biases to the access transistors 5 and the drive transistors Tn in some of the memory cells 1 associated with the substrate potential control signal line 31, for example, in accordance with the state of an initialization data signal RDIN. The substrate potential control circuit 29 also applies back biases to the access transistors 5 and the drive transistors Tn in some of the memory cells 1 associated with the other substrate potential control signal line 32. At this time, the precharging/equalizing circuits 27 precharge/equalize the bit lines BIT and NBIT, as in ordinary operation of the SRAM. Word lines WL as outputs of a word line driver 13 are controlled to floating states, so that leakage current of the access transistors 5 in the memory cells 1 is increased. Then, the application of the forward biases to the access transistors 5 further increases leakage current thereof whereas the application of the back biases to the access transistors 5 suppresses leakage current thereof. At this time, potentials on the precharged bit lines BIT and NBIT appear at internal nodes 1c toward the access transistors 5 to which the forward biases have been applied, and internal nodes 1d toward the access transistors 5 to which the back biases have been applied shift to a ground potential VSS because of leakage current of the drive transistors Tn. As in the fourth embodiment, when potential differences generated in the memory cells 1 by power-on of a memory cell array 2 and then the initializing signal RST is set in an disable state, the substrate potential control signal lines 31 and 32 transition to the ground potential VSS.

In this embodiment, in addition to the advantages of the fourth embodiment, application of forward biases to the access transistors 5 increases leakage current, so that a larger potential difference is generated between the internal nodes 1c and 1d in each of the memory cells 1 and thereby more stable initialization is performed. In addition, the precharging/equalizing circuits 27 are also used as bias circuits while operating as originally intended in the SRAM. Accordingly, no complicated control is required.

EMBODIMENT 7

Figure 8:
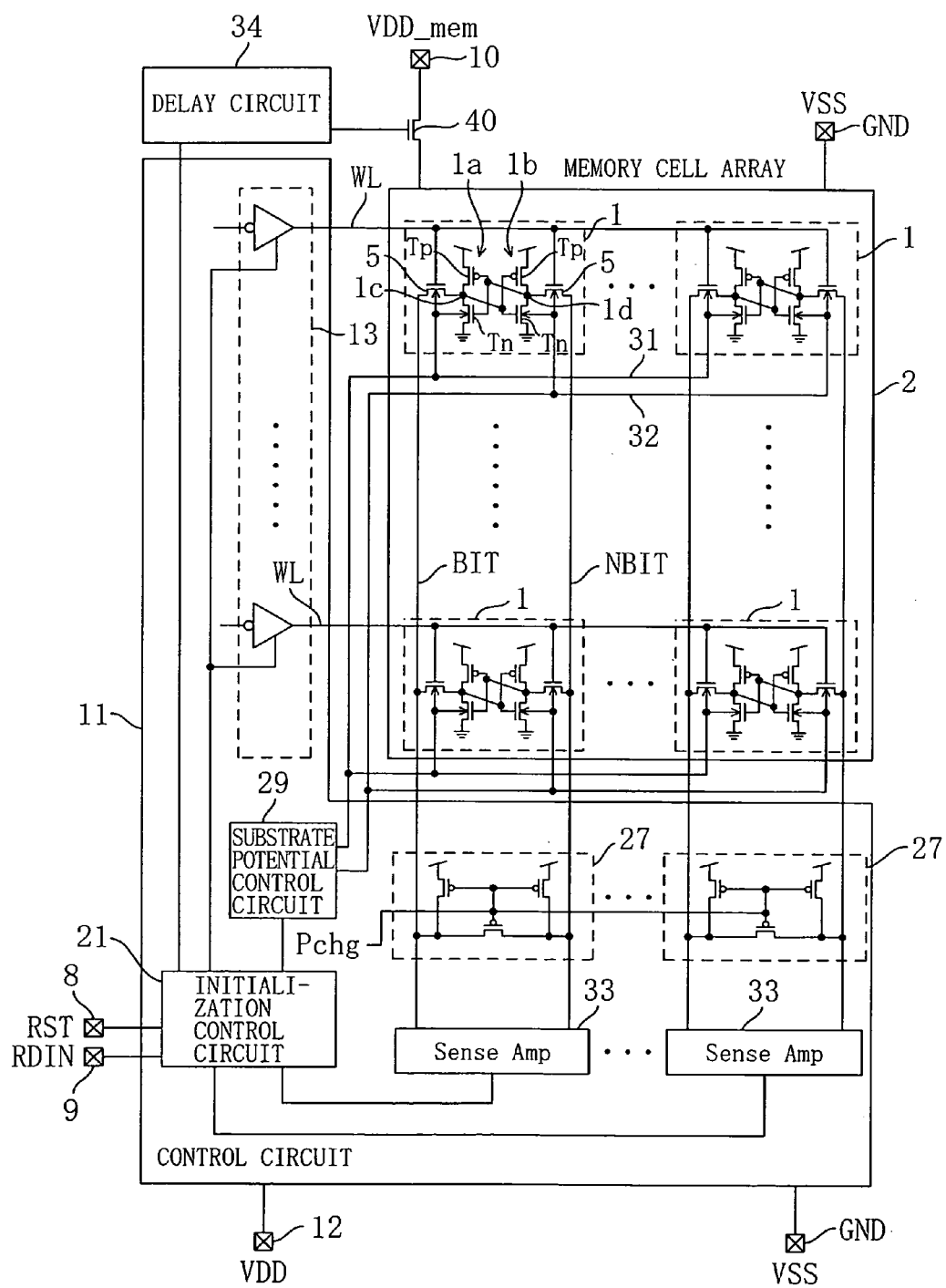
FIG. 8 is a circuit diagram showing a semiconductor memory device according to a seventh embodiment of the present invention.

FIG. 8 is a circuit diagram showing an SRAM as a semiconductor memory device according to a seventh embodiment of the present invention. In FIG. 8, each component identical with that of the SRAM of the sixth embodiment shown in FIG. 7 is denoted by the same reference numeral, and description thereof will be omitted.

As shown in FIG. 8, in this embodiment, a delay circuit 34 receiving the output of an initialization control circuit 21 is provided. The output of the delay circuit 34 is connected to the gate of a switching transistor 40 interposed in a line between a memory cell power supply terminal 10 and a memory cell array 2. The outputs of sense amplifiers 33 each provided between a pair of bit lines BIT and NBIT are fed back to the initialization control circuit 21. The initialization control circuit 21 has a function of controlling read operation of the SRAM.

Operation of the semiconductor memory device of this embodiment having the foregoing configuration will be hereinafter described. The operation of the semiconductor memory device of this embodiment is basically the same as that of the sixth embodiment, but is different from that of the sixth embodiment in the following aspects.

In this embodiment, when an initializing signal RST is input to the initialization control circuit 21, a substrate potential control circuit 29 applies forward biases to access transistors 5 and drive transistors Tn in memory cells 1 in accordance with an initialization data signal RDIN. Then, at the timing at which potential differences are generated between internal nodes 1c and 1d in the memory cells 1, the delay circuit 34 controlled by the initialization control circuit 21 turns the switching transistor 40 ON so as to supply a power supply potential VDD_mem from the memory cell power supply terminal 10 to the memory cell array 2, thereby initializing the memory cell array 2. Thereafter, read operation of the SRAM is performed by the initialization control circuit 21 and the outputs of the sense amplifiers 33 are supplied to the initialization control circuit 21 to verify the initialization state of the memory cell array 2 and are compared with initialization data. If the outputs of the sense amplifiers 33 and logical values of the initialization data do not coincide with each other, the amount of the forward biases applied from the substrate potential control circuit 29 and the delay amount of the delay circuit 34 are increased, and initialization operation is repeated until the comparison result shows coincidence.

In this embodiment, the initialization state of the memory cell array 2 is monitored, so that a substrate potential and the timing of supplying memory-cell power are automatically adjusted. Accordingly, in addition to the advantages of the sixth embodiment, initialization of the memory cells 1 to desired data is ensured with a sufficient time.

EMBODIMENT 8

Figure 9:
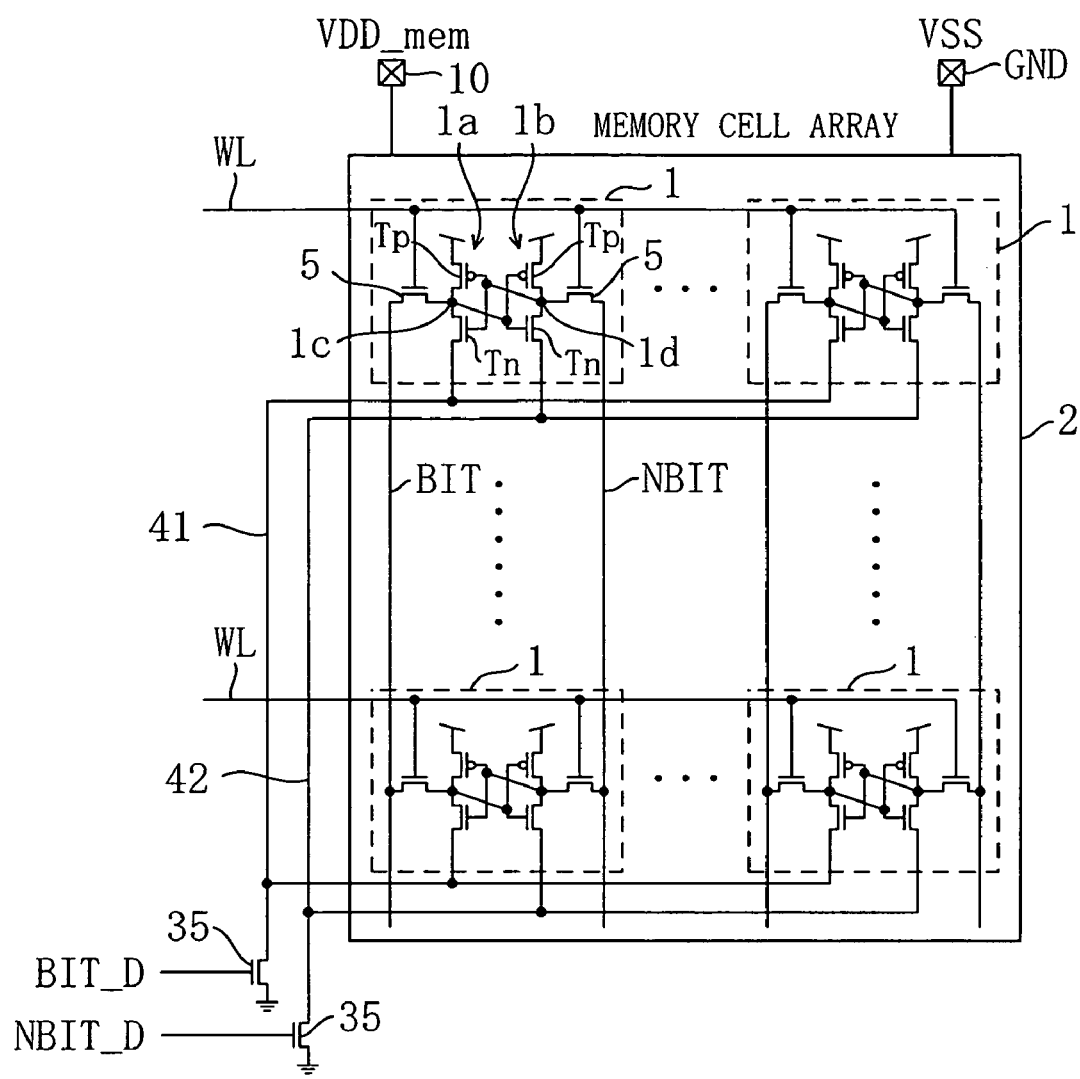
FIG. 9 is a circuit diagram showing a memory cell array of a semiconductor memory device according to an eighth embodiment of the present invention.

FIG. 9 is a circuit diagram showing an SRAM as a semiconductor memory device according to an eighth embodiment of the present invention. In FIG. 9, each component identical with that of the SRAM of the sixth embodiment shown in FIG. 7 is denoted by the same reference numeral, and description thereof will be omitted. Though not shown, a control circuit similar to the control circuit 11 shown in FIG. 7 is provided in this embodiment.

As shown in FIG. 9, source nodes of drive transistors Tn in memory cells 1 are connected to a ground potential VSS via lines 41 and 42 and switching transistors 35. The gate of one of the switching transistors 35 interposed in the line 41 is connected to a BIT-side drive transistor source potential control line BIT_D. The gate of the other switching transistor 35 interposed in the line 42 is connected to an NBIT-side drive transistor source potential control line NBIT_D. Potentials at substrate regions of access transistors 5 and drive transistors Tn in the memory cells 1 are set at a ground potential VSS.

Operation of the semiconductor memory device of this embodiment having the foregoing configuration will be hereinafter described. The operation of the semiconductor memory device of this embodiment is basically the same as that of the sixth embodiment, but is different from that of the sixth embodiment in the following aspects.

In this embodiment, in a case where a power supply potential VDD is supplied to bit lines BIT and NBIT, if the BIT-side drive transistor source potential control line BIT_D is set at a ground potential VSS and the switching transistor 35 interposed in the line 41 is turned OFF so that the source nodes of the drive transistors Tn in inverters 1a in the memory cells 1 are controlled to floating states, paths for leakage current of the drive transistors Tn are interrupted. Accordingly, the potentials of internal nodes 1c in the memory cells 1 are caused to approach the power supply potential VDD by leakage current of the access transistors 5. On the other hand, the NBIT-side drive transistor source potential control line NBIT_D is set at a high potential and the switching transistor 35 interposed in the line 42 is turned ON, the potential of internal nodes 1d in the memory cells 1 are caused to approach the ground potential VSS by leakage current of the drive transistors Tn of inverters 1b in the memory cells 1. Accordingly, potential differences between the internal nodes 1c and 1d in the memory cells 1 are increased.

In this embodiment, in addition to the advantages of the sixth embodiment, substrate biases do not need to be controlled, so that the layout area is easily reduced without the need of regions such as substrate isolation.

EMBODIMENT 9

Figure 10:
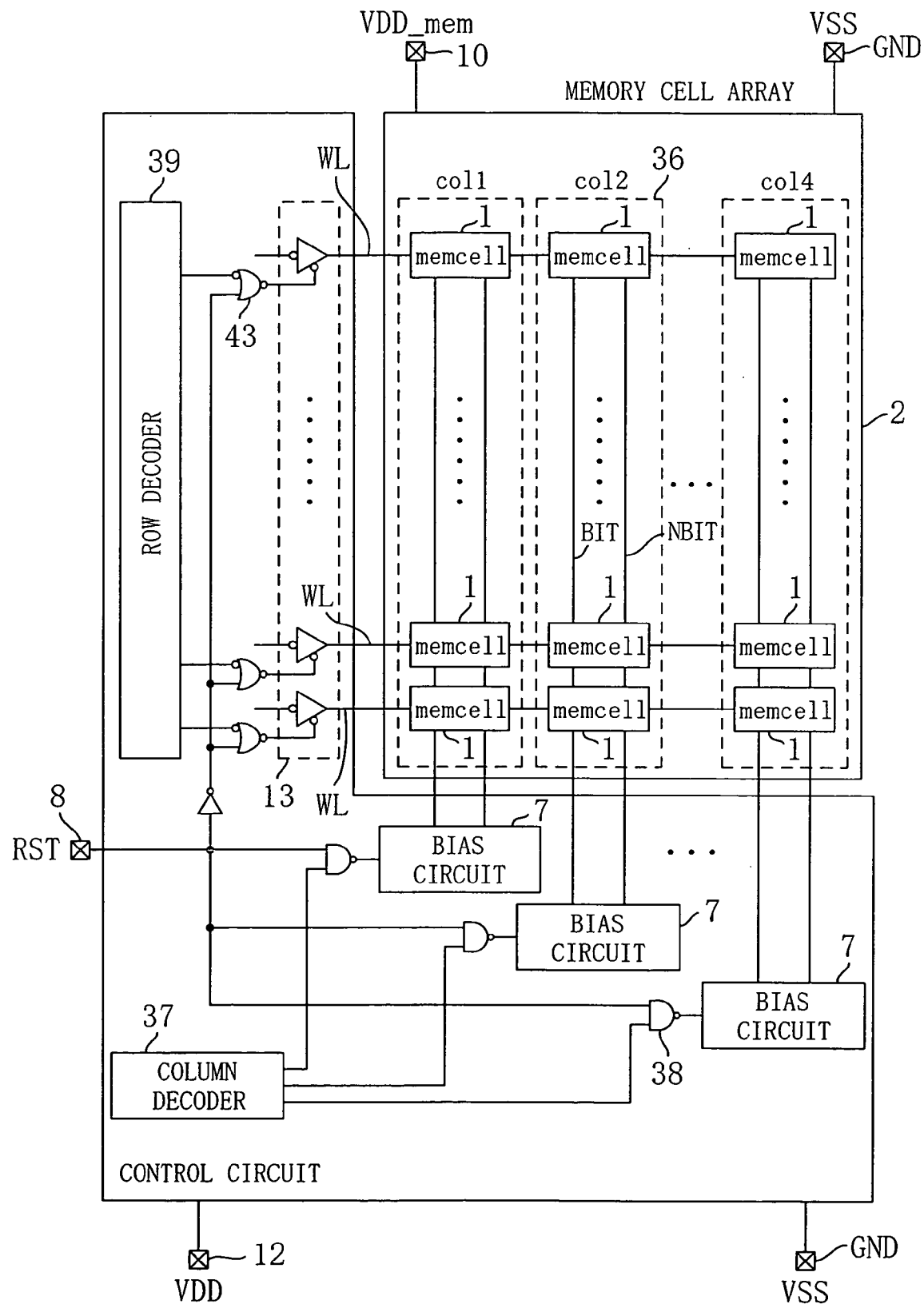
FIG. 10 is a circuit diagram showing a semiconductor memory device according to a ninth embodiment of the present invention.

FIG. 10 is a circuit diagram showing an SRAM as a semiconductor memory device according to a ninth embodiment of the present invention. In FIG. 10, each component identical with that of the SRAM of the second embodiment shown in FIGS. 3A and 3B is denoted by the same reference numeral, and description thereof will be omitted.

As shown in FIG. 10, a memory cell array 2 is divided into a plurality of columns 36 (col1, col2, . . . ). A pair of bit lines BIT and NBIT connected to memory cells 1 (memcell); and a bias circuit 7 for initialization connected to the bit lines BIT and NBIT are provided for each of the columns 36. The bias circuits 7 are connected to the output sides of respective logic gates 38 each for performing logical operation on an initializing signal RST and a decoded signal from a column decoder 37. Outputs of logic gates 43 each for performing logical operation on an inverted signal of an initializing signal RST and a decoded signal from a row decoder 39 are connected to a word line driver 13 with a tristate output.

Operation of the semiconductor memory device of this embodiment having the foregoing configuration will be hereinafter described. The operation of the semiconductor memory device of this embodiment is basically the same as that of the second embodiment but is different from that of the second embodiment in the following aspects.

In this embodiment, when an initializing signal RST is set in an enable state, the logic gates 38 select one of the bias circuits 7 for initialization, in accordance with a decoding result of the column decoder 37. In the same manner, the logic gates 43 change at least one of the outputs of the word line driver 13 to a disable state in accordance with a decoding result of the row decoder 39. Accordingly, initialization is performed on at least one of the memory cells 1 in a memory cell array 2 associated with the selected bias circuit 7 for initialization and the selected output of the word line driver 13, as in the second embodiment. When the initializing signal RST is set in a disable state, all the bias circuits 7 for initialization are in non-selected state and all the output of the word line driver 13 are set in enable states.

In this embodiment, in addition to the advantages of the second embodiment, at least one of the memory cells 1 in the memory cell array 2 is only allowed to be initialized to have desired data.

As described above, in the semiconductor memory devices according to the present invention, the gate sizes of transistors in memory cells do not need to be asymmetric, and potential differences are generated between first and second internal nodes in the memory cells so that data in the memory cells are initialized as intended. Accordingly, the semiconductor memory devices of the present invention are applicable as SRAMs each including memory cells arranged in rows and columns and performing write or read operation at random, or as system LSIs provided with SRAMs.

In the foregoing embodiments, as a configuration of an SRAM memory cell, inverters 1a and 1b each including a p-FET and an n-FET connected in series between a power supply terminal and a ground are provided. Instead of the p-FET, a resistor may be provided in the embodiments. In such a case, the same advantages as those in the embodiments are obtained.

The components in the foregoing embodiments and modified examples thereof may be variously combined as long as these combinations are logically permitted. Specifically, for example, the bias circuits 7 of the embodiments may be replaced with each other. The control of a substrate potential as in the sixth and seventh embodiments may be applied to the other embodiments. Feedback controls of at least one of a substrate potential and a delay time as in the seventh embodiment may be applied to the other embodiments.

What is claimed is:

1. A semiconductor memory device, comprising:
 a memory cell array including a plurality of memory cells arranged in rows and columns;
 a pair of bit lines connected to a column of the memory cells in the memory cell array;
 a word line connected to a row of the memory cells in the memory cell array;
 a memory cell power supply terminal for supplying a power supply potential to the memory cells in the memory cell array;
 a control circuit for controlling operation of the memory cells in the memory cell array; and
 a control circuit power supply terminal for supplying a power supply potential to the control circuit, the control circuit power supply terminal being electrically separated from the memory cell power supply terminal,
 wherein each of the memory cells includes
  a pair of first and second inverters including first and second internal nodes, respectively, each one of the first and second inverters further including a resistor and a drive transistor connected in series via the first or second internal node and receiving an output from the other inverter, and
  first and second access transistors, one of which is interposed between one of the first and second internal nodes and one of the bit lines and the other of which is interposed between the other one of the first and second internal nodes and the other bit line, and
 wherein at startup, a power supply potential is supplied from the control circuit power supply terminal to the control circuit and then a power supply potential is supplied from the memory cell power supply terminal to the memory cell array.

2. The semiconductor memory device of claim 1, further comprising bit line potential fixing means for fixing only one of the bit lines at a potential higher than a ground potential after the power supply potential has been supplied to the control circuit and before the power supply potential is supplied to the memory cell array, upon reception of an initializing signal at the startup.

3. The semiconductor memory device of claim 2, wherein the bit line potential fixing means selectively fixes only a predetermined one of the bit lines at the potential higher than the ground potential.

4. The semiconductor memory device of claim 1, further comprising bit line potential fixing means for fixing one of the bit lines at a potential higher than a ground potential and fixing the other bit line at the ground potential after the power supply potential has been supplied to the control circuit and before the power supply potential is supplied to the memory cell array, upon reception of an initializing signal at the startup.

5. The semiconductor memory device of claim 4, wherein the bit line potential fixing means selectively fixes a predetermined one of the bit lines at the potential higher than the ground potential and selectively fixes the other bit line at the ground potential.

6. The semiconductor memory device of claim 2, further comprising an intermediate potential generator for generating an intermediate potential between the power supply potential and the ground potential of the control circuit,
wherein the potential fixed by the bit line potential fixing means is the intermediate potential generated by the intermediate potential generator.

7. The semiconductor memory device of claim 6, wherein the intermediate potential generator has a configuration including transistor columns each formed by connecting a p-channel field effect transistor including short-circuited gate and drain and an n-channel field effect transistor in series, and the transistor columns are associated with the respective bit lines.

8. The semiconductor memory device of claim 6, wherein the intermediate potential generator has a configuration including transistor columns each formed by connecting a p-channel field effect transistor including short-circuited gate and drain and a p-channel field effect transistor in series, and the transistor columns are associated with the respective bit lines.

9. The semiconductor memory device of claim 2, wherein the bit line potential fixing means also serves as a precharging circuit.

10. The semiconductor memory device of claim 4, wherein the bit line potential fixing means also serves as a sense amplifier.

11. The semiconductor memory device of claim 1, further comprising a substrate potential controlling circuit for applying a forward bias to a substrate region in the memory cell array.

12. The semiconductor memory device of claim 1, wherein the drive transistors and the access transistors in the memory cells are n-channel field effect transistors, and
the semiconductor memory device further comprises a substrate potential controlling circuit for applying a forward bias to a substrate region of the drive transistor and the access transistor in one of the first and second inverters in each of the memory cells.

13. The semiconductor memory device of claim 11, further comprising a sense amplifier for detecting an initialization state of the memory cell array, the sense amplifier being provided between the bit lines,
wherein the substrate potential controlling circuit controls the amount of the forward bias applied to the substrate region in the memory cell array, in accordance with the initialization state of the memory cell array.

14. The semiconductor memory device of claim 1, further comprising delay means for supplying a power supply potential to the memory cell array in accordance with an initializing signal, only when a given delay time has elapsed after reception of the initializing signal.

15. The semiconductor memory device of claim 14, further comprising:
a sense amplifier for detecting an initialization state of the memory cell array, the sense amplifier being provided between the bit lines;
a substrate potential controlling circuit for controlling the amount of a forward bias applied to a substrate region in the memory cell array, in accordance with the initialization state of the memory cell array; and
setting means for setting the amount of the forward bias controlled by the substrate potential controlling circuit and the delay time of the delay means.

16. The semiconductor memory device of claim 1, wherein the drive transistors in the memory cells are n-channel field effect transistors, and
the semiconductor memory device further comprises a substrate potential controlling circuit for controlling a source potential of each of the drive transistors between a floating state and a ground state.

17. The semiconductor memory device of claim 2, wherein the bit line potential fixing means fixes one of the bit lines connected to at least one selected column of the memory cells in the memory cell array at the potential higher than the ground potential and fixes the other bit line at the ground potential.

18. The semiconductor memory device of claim 2, further comprising word line potential opening means for controlling a word line to a floating state when the bit line potential fixing means sets the potential of said one of the bit lines.

* * * * *